United States Patent
Imaoka

(10) Patent No.: US 8,149,385 B2
(45) Date of Patent: Apr. 3, 2012

(54) ALIGNMENT UNIT AND EXPOSURE APPARATUS

(75) Inventor: Nobuo Imaoka, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 388 days.

(21) Appl. No.: 12/563,748

(22) Filed: Sep. 21, 2009

(65) Prior Publication Data

US 2010/0073656 A1 Mar. 25, 2010

(30) Foreign Application Priority Data

Sep. 25, 2008 (JP) .................. 2008-246364
Jun. 4, 2009 (JP) .................. 2009-134737

(51) Int. Cl.
*G03B 27/52* (2006.01)
*G03B 27/42* (2006.01)

(52) U.S. Cl. .................. 355/55; 355/53

(58) Field of Classification Search .................. 355/52, 355/53, 55, 67, 77; 250/548; 430/311
See application file for complete search history.

(56) References Cited

U.S. PATENT DOCUMENTS 5,532,091 A 7/1996 Mizutani
5,986,766 A 11/1999 Koga
6,876,946 B2 * 4/2005 Yasuda et al. ............ 702/152
7,170,603 B2 1/2007 Katayama
2004/0126004 A1 * 7/2004 Kikuchi .................. 382/141

FOREIGN PATENT DOCUMENTS

| JP | 2-142110 A | 5/1990 |
| JP | 2-294015 A | 12/1990 |
| JP | 5-036583 A | 2/1993 |
| JP | 7-249558 A | 9/1995 |
| JP | 7-263332 A | 10/1995 |
| JP | 7-321012 A | 12/1995 |
| JP | 9-218714 A | 8/1997 |
| JP | 2000-021766 A | 1/2000 |

* cited by examiner

*Primary Examiner* — Hung Henry Nguyen
(74) *Attorney, Agent, or Firm* — Canon U.S.A., Inc. IP Division

(57) ABSTRACT

An alignment unit includes a measurement unit configured to measure a coordinate of a center position of an alignment mark transferred to each layer that is located under an uppermost layer of a substrate, and a controller configured to determine a target coordinate of the center position of the alignment mark transferred to the uppermost layer of the substrate based on a result of a weighted average that is made by weighting the coordinate of the center position of the alignment mark of each layer of the substrate measured by the measurement unit using as a weight a function inversely proportional to a minimum critical dimension of the pattern of an original formed on each layer of the substrate.

6 Claims, 4 Drawing Sheets

ALIGNMENT UNIT AND EXPOSURE APPARATUS

BACKGROUND OF THE INVENTION

1. Field of the Invention

The present invention relates to an alignment unit and an exposure apparatus.

2. Description of the Related Art

For an alignment used for an exposure apparatus, Japanese Patent Laid-Open Nos. ("JPs") 2-142110 and 5-36583 propose to accord a value of a weighted average of coordinates of alignment marks formed on a layer that is located under a target layer on a substrate, with a coordinate of an alignment mark on the target layer. JP 7-263332 proposes, in measuring a position of an alignment mark on each layer, to add a calculated offset value to the position of the alignment mark. JP 7-321012 proposes a method for using a value of a weighted average as a reference position to expose a pattern of a next upper layer, which weighted average is made with a weight that includes a measurement error in measuring a position of an alignment mark formed on a first layer on a substrate and a necessary alignment precision of each layer. Other prior art include JPs 2000-21766, 9-218714, and 2-294015.

However, none of JPs. 2-142110, 5-36583, 7-263332, and 7-321012 discloses a concrete value of the weight. It is conceivable to determine the weight in accordance with the relevancy to the pattern of the original. Nevertheless, when the pattern of the lowermost layer in which the pattern generally has a minimum critical dimension ("CD") is less relevant to the pattern of the original, a positional shift amount increases problematically between a pattern of an uppermost layer and a pattern of the lowermost layer. It is also conceivable to determine a weight through a simulation but this method is arduous.

SUMMARY OF THE INVENTION

The present invention provides an alignment unit and an exposure apparatus which can precisely and a comparatively easily align an original with a substrate.

An alignment unit according to one aspect of the present invention aligns a pattern of an original having the pattern and an alignment mark, with an area in an uppermost layer in a plurality of layers of a substrate in transferring the pattern to the area. The alignment unit includes a measurement unit configured to measure a coordinate of a center position of the alignment mark transferred to each layer that is located under the uppermost layer of the substrate, and a controller configured to determine a target coordinate of the center position of the alignment mark transferred to the uppermost layer of the substrate based on a result of a weighted average that is made by weighting the coordinate of the center position of the alignment mark of each layer of the substrate measured by the measurement unit using as a weight a function inversely proportional to a minimum critical dimension of the pattern of the original formed on each layer of the substrate.

Further features of the present invention will become apparent from the following description of exemplary embodiments with reference to the attached drawings.

DESCRIPTION OF THE EMBODIMENTS

Figure 1:
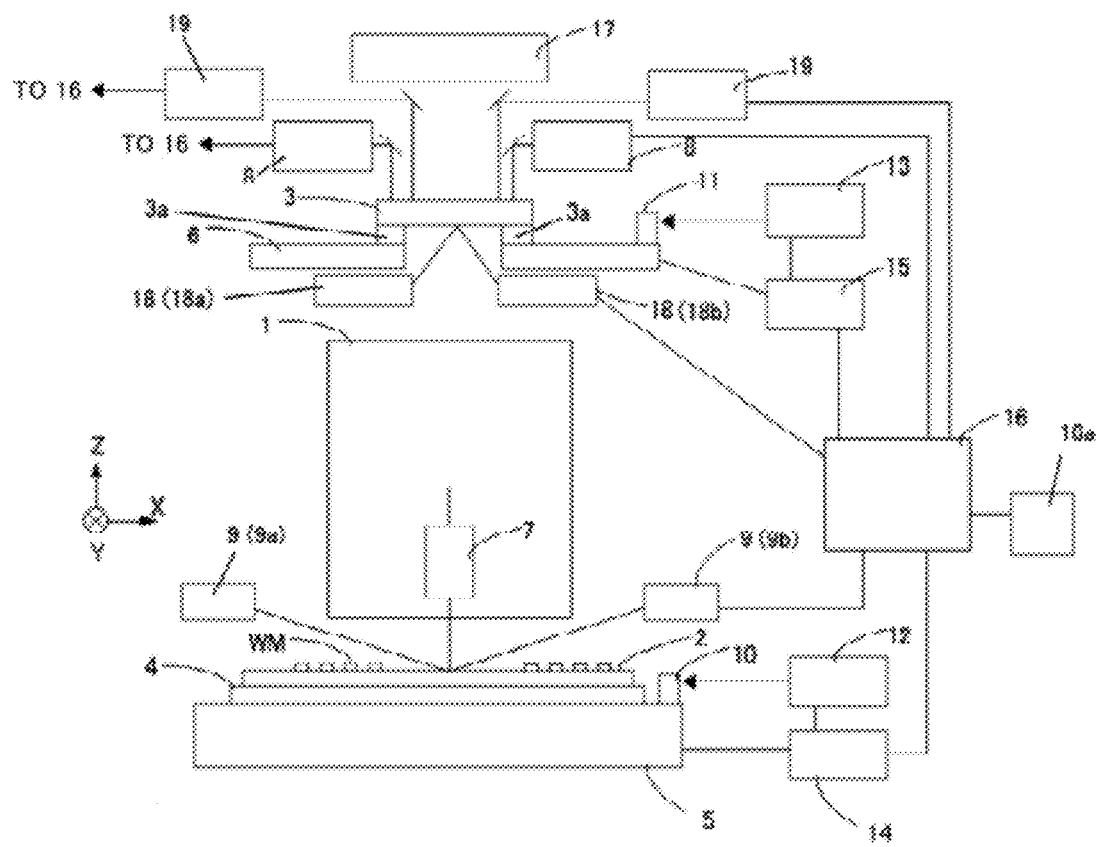
FIG. 1 is a block diagram of an exposure apparatus of this embodiment.

FIG. 1 is a block diagram of an exposure apparatus according to this embodiment. The exposure apparatus of this embodiment is a step-and-scan exposure apparatus but is applicable to a step-and-repeat exposure apparatus. The exposure apparatus illuminates an original 3, such as a mask or a reticle, using an illumination unit 17, and exposes a substrate 2, such as a wafer and a liquid crystal substrate, via a projection optical system 1.

The projection optical system 1 projects an image of a pattern of the original 3 onto the substrate 2, and maintains the substrate 2 and the original 3 in an optically conjugate relationship. The substrate 2 is exposed with the pattern, and an area for a single exposure is referred to as a shot. The substrate 2 is held by a substrate stage 5 via a substrate holder 4. The original 3 has an alignment mark and a pattern to be transferred, and holds an original 6 via an original holder 3a. The illumination unit 17 includes a light source, such as a laser or a mercury lamp, and an illumination optical system configured to uniformly illuminate the original 3.

The exposure apparatus further includes a focus measurement system and an alignment unit.

The focus measurement system measures a surface position of the substrate 2 in the Z direction so as to accord the surface of the substrate 2 with an imaging plane of the projection optical system 1. The focus measurement system includes a pair of obliquely-incident-light measurement units 9 and 18.

The obliquely-incident-light measurement unit 9 is arranged at both side surfaces of the projection optical system, measures Z coordinates of the substrate and the shot area on the substrate 2, their inclinations in the X direction, and their inclinations in the Y direction, and includes a light projection unit 9a and a light receiving unit 9b. The light projection unit 9a projects the obliquely incident light that slightly inclines relative to the X direction, upon the substrate 2. The obliquely incident light includes a plurality of light beams, which are arranged at constant intervals with regularity. The obliquely incident light is reflected on the substrate plane, and enters the light receiving unit 9b for positional measurements. The light receiving unit 9b is arranged at a position symmetrical to the light projection unit 9a with respect to the Y-axis direction that passes a reference point just under the projection optical system 1. The measurement result is supplied to the controller 16. Thereby, the controller 16 can obtain the Z direction, the inclination in the X direction, the inclination in the Y direction, and the chip surface shape of the chip area in the substrate just under the projection optical system 1.

The obliquely-incident-light measurement unit 18 measures a Z coordinate, an inclination in the X direction, and an inclination in the Y direction of the original 3, and includes a light projection unit 18a and a light receiving unit 18b. The light projection unit 18a projects the obliquely incident light that slightly inclines relative to the X direction, upon the original 3. The obliquely incident light includes a plurality of light beams, which are arranged at constant intervals with regularity. The obliquely incident light is reflected on the bottom surface of the original, and enters the light receiving unit 18b for positional measurements. The light receiving unit 18b is arranged at a position symmetrical to the light projection unit 18a with respect to the Y-axis direction that passes a reference point just above the projection optical system 1. The measurement result is supplied to the controller 16. Thereby, the controller 16 can obtain the Z direction, the inclination in the X direction, the inclination in the Y direction, and an original surface shape of the area in the original 3 just above the projection optical system 1.

The alignment unit is used to align a shot with the original pattern in transferring the original pattern to the shot (area) of one layer (such as an uppermost layer) in a plurality of layers of the substrate 2. The alignment unit has a function of aligning each shot of the substrate 2 for each layer with the original 3, and a function of aligning the patterns of the respective layers with one another so as to maintain the overlay accuracy among the patterns of a plurality of layers in the substrate. This embodiment will focus on the latter function. The alignment unit includes a drive system configured to drive the substrate 2 or the original 3, a variety of measurement units, and the controller 16 configured to control the drive system based on the measurement result of a variety of measurement units.

The drive system includes a drive system for the substrate 2, and a drive system for the original 3.

The drive system for the substrate 2 includes a substrate stage 5, a substrate stage bar mirror 10, a substrate stage position measurement unit 12, and a substrate stage driver 14.

The substrate stage 5 includes an XY stage configured to two-dimensionally position the substrate 2 in a plane perpendicular to the optical axis of the projection optical system 1, a Z stage configured to position the substrate 2 in a Z direction parallel to the optical axis of the projection optical system 1, and a stage configured to rotate the substrate 2 by a fine angle. The substrate stage bar mirror 10 is fixed onto the top surface of the substrate stage 5, and the substrate stage position measurement unit 12 opposes to the substrate stage bar mirror 10.

Although simplified in FIG. 1, the X axis and the Y axis are set to the orthogonal coordinate system on the plane perpendicular to the optical axis of the projection optical system 1, and the substrate stage bar mirror 10 has a plane mirror having a reflection surface perpendicular to the X axis and a plane mirror having a reflection surface perpendicular to the Y axis.

The substrate stage position measurement unit 12 includes a laser interferometer. The substrate stage position measurement unit 12 includes two X-axis substrate stage position measurement units configured to irradiate a laser beam upon the substrate stage bar mirror 10 along the X axis, and a Y-axis substrate stage position measurement unit configured to irradiate a laser beam upon the substrate stage bar mirror 10 along the Y axis. The substrate stage position measurement unit 12 measures the X and Y coordinates of the substrate stage 5. A rotation angle of the substrate stage 5 is measured as a measurement value different of the two X-axis substrate stage position measurement units 12. Information of the X coordinate, the Y coordinate, and the rotational angle measured by the substrate stage position measurement unit 12 is transmitted to the substrate stage driver 14 and the controller 16.

The controller 16 controls the substrate stage driver 14 and positions the substrate stage 5 based on the coordinate of the substrate stage 5 measured by the substrate stage position measurement unit 12.

The drive system for the original 3 includes an original stage 6, the original stage bar mirror 11, an original stage position measurement unit 13, and an original stage driver 15. Their structures and operations are similar to those of the substrate stage 5, the substrate stage bar mirror 10, the substrate stage position measurement unit 12, and the substrate stage driver 14, and a description thereof will be omitted.

A variety of measurement units include an off-axis measurement unit 7, an alignment measurement unit 8, and a through the lens ("TTL") measurement unit 19.

The off-axis measurement unit 7 is provided on the side surface of the projection optical system 1, and includes an illumination unit, an imaging optical system, an image pickup part, and a controller. In the off-axis measurement unit 7, images of alignment marks 21-28, which will be described later, are focused upon an image pickup plane of an X-axis image pickup device that includes an X-axis two-dimensional CCD, and an image pickup plane of a Y-axis image pickup device that includes a Y-axis two-dimensional CCD. The respective images and index mark images on an index plate (not shown) are formed on the image pickup plane of the image pickup device. The image pickup signals of both the image pickup devices are supplied to the controller 16, and a positional shift amount (or distance) in the X-axis direction and a positional shift amount (or distance) in the Y-axis direction can be calculated between each of the images of the alignment marks 21-28 and the index mark (reference position).

The alignment measurement unit 8 observes an original reference mark formed on the original 3 and an original reference mark formed on the original stage 6, and provides an alignment between them. The TTL measurement unit 19 uses a scope (not shown) and non-exposure light, and measures a stage reference mark that has returned through the projection optical system 1 without passing the original 3.

Figure 2B:
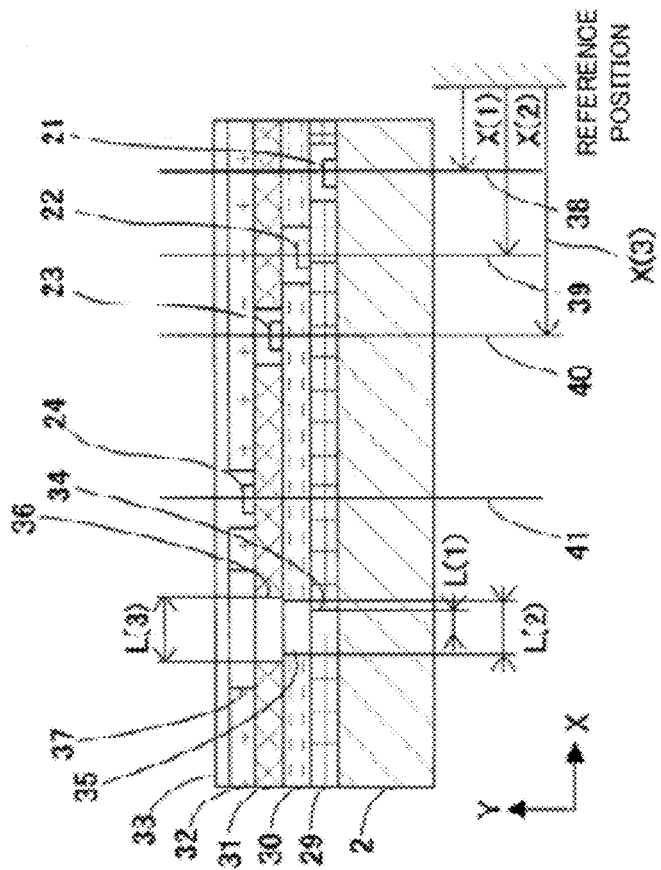
FIG. 2B is a sectional view of the substrate shown in FIG. 1.
Figure 2A:
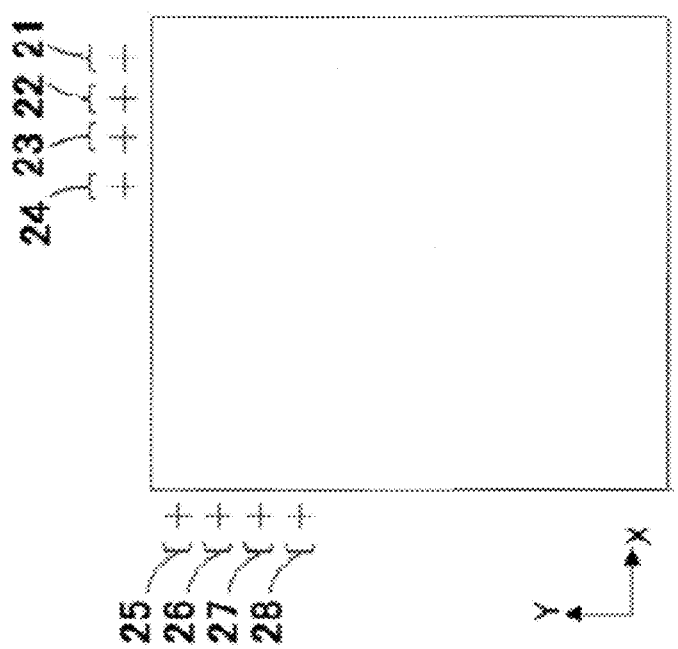
FIG. 2A is a plane view of a substrate shown in FIG. 1.

FIG. 2A is a plane view showing an arrangement of the alignment marks for one shot on the substrate 2. FIG. 2B is a partially sectional view of FIG. 2A.

Reference numeral 21 denotes an X-axis alignment mark formed on a first layer. Reference numeral 22 denotes an X-axis alignment mark formed on a second layer. Reference numeral 23 denotes an X-axis alignment mark formed on a third layer. Reference numeral 24 denotes an X-axis alignment mark formed on a fourth layer.

Reference numeral 25 denotes a Y-axis alignment mark formed on a first layer. Reference numeral 26 denotes a Y-axis alignment mark formed on a second layer. Reference numeral 27 denotes a Y-axis alignment mark formed on a third layer. Reference numeral 28 denotes a Y-axis alignment mark formed on a fourth layer.

The first layer, the second layer, the third layer, and the fourth layer are arranged in a direction perpendicular to a surface to be exposed of the substrate 2 from a lowermost layer to an uppermost layer. The first layer is the lowermost layer.

Reference numeral 29 denotes the first layer on the substrate, reference numeral 30 denotes the second layer on the substrate, reference numeral 31 denotes the third layer on the substrate, and reference numeral 32 denotes the fourth layer on the substrate. Reference numeral 33 denotes a photoresist applied to the substrate. Reference numeral 34 denotes a pattern on the first layer on the substrate, reference numeral 35 denotes a pattern of the second layer on the substrate, reference numeral 36 denotes a pattern of the third layer on the substrate, and reference numeral 37 denotes a pattern of the fourth layer on the substrate.

Reference numeral 38 denotes a center position of the X-axis alignment mark 21 formed in the first layer. Reference numeral 39 denotes a center position of the X-axis alignment mark 22 formed in the second layer. Reference numeral 40 denotes a center position of the X-axis alignment mark 23 formed in the third layer. Reference numeral 41 denotes a center position of the X-axis alignment mark 24 formed in the fourth layer.

The original 3 has the alignment mark and the pattern formed on each layer of the substrate 2. The off-axis measurement unit 7 measures the positions of the X-axis alignment mark and the Y-axis alignment mark on a certain layer on the substrate 2, and the controller 16 calculates the overlay position for the overlay of these patterns.

Figure 3A:
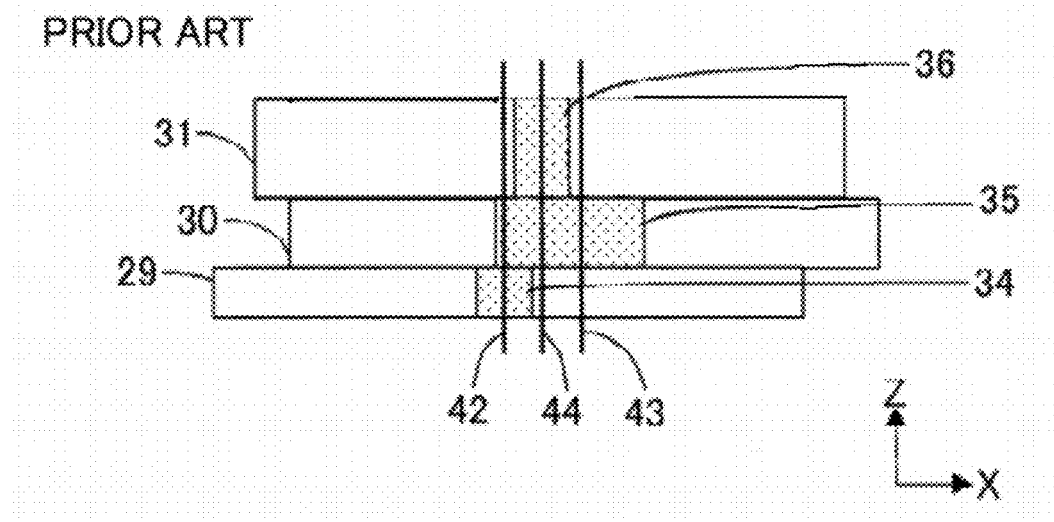
FIGS. 3A and 3B are schematic sectional views for explaining an overlay effect.

FIG. 3A is a schematic sectional view of a prior art overlay result. The prior art example shown in FIG. 3A provides an alignment using a weighted average by setting the weights of the first layer and the second layer to equal values. It is understood that a center position 42 of a pattern 34 of the first layer, and a center position 44 of a pattern 36 of the third layer shift in the plus side of the X axis.

Figure 3B:
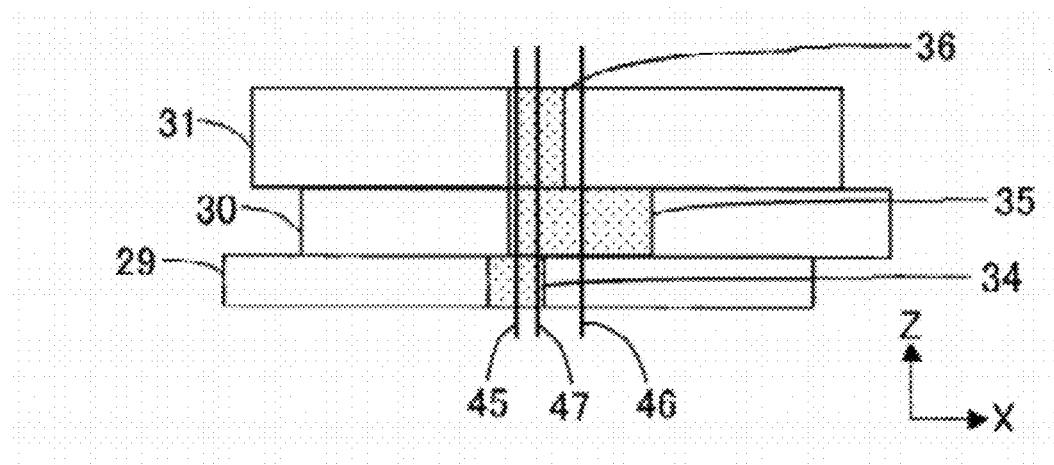

FIG. 3B is a schematic sectional view showing an overlay result of this embodiment. According to this embodiment shown in FIG. 3B, it is understood that a shift amount reduces between a center position 45 of the pattern 34 of the first layer and a center position 47 of the pattern 36 of the third layer. In forming a pattern of a next layer when the substrate has a pattern of the lowermost layer on the substrate, the center position of the pattern of the next layer may be accorded with the center position of the pattern of the lowermost layer. The CD of the pattern is generally minimum in the lowermost layer, and the CD is likely to increase as the layer moves to the uppermost layer. Accordingly, this embodiment uses a reciprocal of a minimum CD of a pattern as a weight for the weighted average, which weight is determined by a function inversely proportional to the minimum CD.

Figure 4:
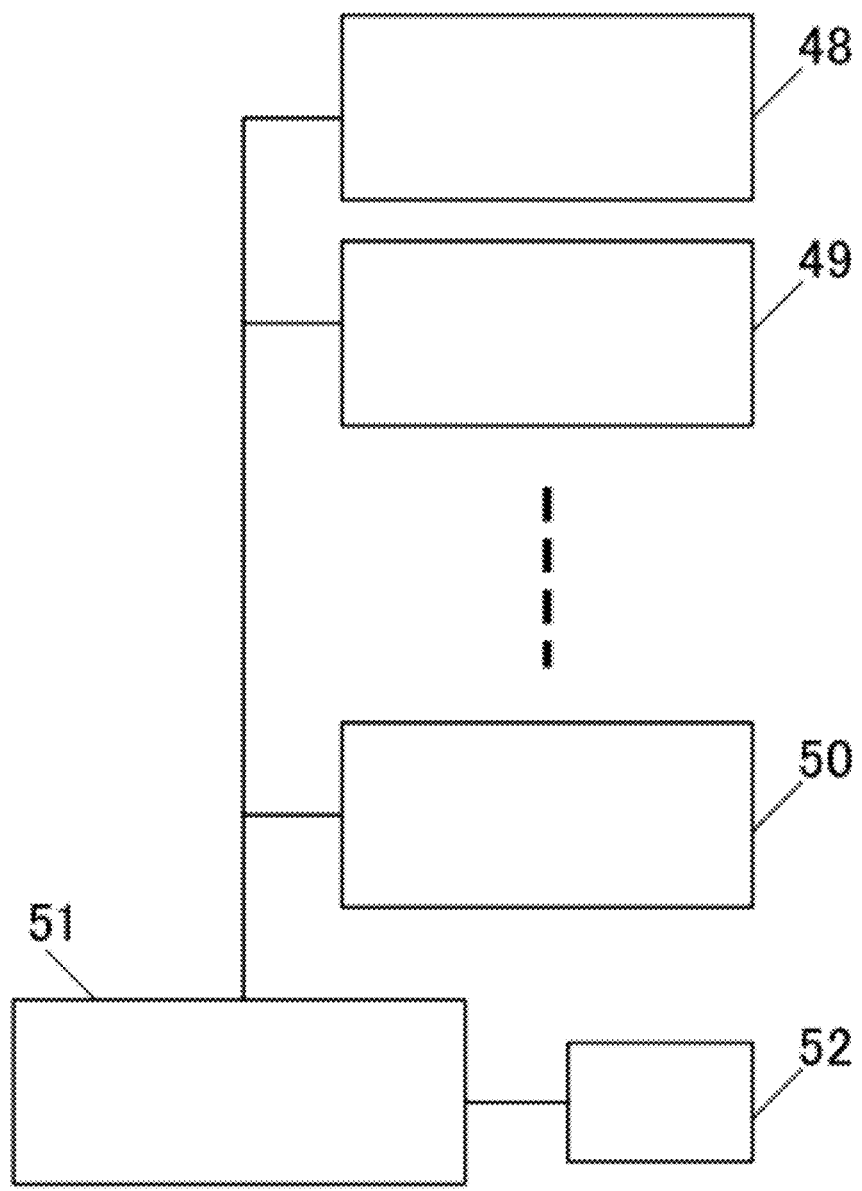
FIG. 4 is a schematic view of a configuration that sends data from an on-line database to the exposure apparatus.

FIG. 4 shows a schematic view showing a configuration that calculates a weight of each layer at a host 51 and a database 52 on the facility side, and sends the weight to exposure apparatuses 48-50. The facility database 52 controls information of a pattern CD of each layer on the substrate, offset information of the originals used to expose each layer, and offset information peculiar to alignment units used to expose each layer. The host 51 calculates the weight of each layer with a function inversely proportional to the minimum CD, and on-line transfers data of the weight of each layer, the offset information of each layer of the original and the alignment unit to the exposure apparatus to be used to expose the pattern of the next layer.

The weighted average performed by the controller 16 will now be described in detail. For simplicity, an alignment in the X-axis direction will be described.

In aligning the pattern 35 of the second layer with the pattern 34 when the pattern 34 of the first layer has been formed on the substrate 2, the center position 46 (target position) of the pattern 35 of the second layer is accorded with the center position 45 of the pattern 34 of the first layer. More specifically, the controller 16 accords the coordinate 39 (target coordinate AX(2)) of the center position of the alignment mark 22 of the second layer with the coordinate 38 of the center position of the alignment mark 21 of the first layer.

Next, the controller 16 calculates the target coordinate AX(3) of the center position 40 of the alignment mark 23 transferred onto the third layer as the uppermost layer onto the substrate 2 in which the patterns 34 and 35 have been formed up to the second layer. Once the alignment mark 23 is formed as intended, AX(3) is accorded with a distance from the reference position to the center position 40 of the X-axis alignment mark 23 of the third layer on the substrate or the coordinate X(3) of the center position 40 of the alignment mark 23. Here, X(1) is a distance from the reference position to the center position 38 of the X-axis alignment mark 21 of the first layer on the substrate or the coordinate of the center position 38 of the alignment mark 21. X(2) is a distance from the reference position to the center position 39 of the X-axis alignment mark 22 or the coordinate of the center position 39 of the alignment mark 22. L(1) is a minimum CD of the pattern 34 of the first layer on the substrate, and L(2) is a minimum CD of the pattern 35 of the second layer on the substrate. This embodiment uses for L(1) and L(2) the pattern CD formed on the original 3 multiplied by a reduction magnification of the projection optical system 1 rather than the actual pattern CD of the original used for each layer on the substrate 2. Thus, the controller 16 determines the target coordinate of the center position of the alignment mark transferred to the uppermost layer, based on the weighted average result that is made by weighting the coordinate of the center position of the alignment mark of each layer on the substrate 2 with a weight that is a reciprocal of the pattern CD of each layer.

$$AX(3) = \frac{[X(1)/L(1) + X(2)/L(2)]}{1/L(1) + 1/L(2)} \quad \text{Equation 1}$$

By measuring an alignment mark using the off-axis measurement unit 7, the magnification error, the rotational error, the positional error, the orthogonality error, and an aberrational error of the projection optical system can be calculated. The error calculation technique is not limited, and may apply methods disclosed in JPs 2000-21766, 9-218714, and 2-294015.

The overlay accuracy among the transfer image patterns can be improved by adding an error amount as an offset value to the coordinate of the center position of the alignment mark. Where $\Delta X(1)$ denotes an offset value of the pattern 34 of the first layer and $\Delta X(2)$ is an offset value of the pattern of the second layer, a target coordinate AX(3) of the center position 40 of the alignment mark 23 of the third layer is calculated as follows:

$$AX(3) = \frac{[\{X(1) + \Delta X(1)\}/L(1) + \{X(2) + \Delta X(2)\}/L(2)]}{1/L(1) + 1/L(2)} \quad \text{Equation 2}$$

After the pattern 36 of the third layer is transferred, the target coordinate AX(4) of the center position 41 of the alignment mark 24 of the fourth layer can be calculated as follows. $\Delta X(3)$ is an offset value of the pattern 36 of the third layer, and L(3) is a CD of the pattern 36 of the third layer.

$$AX(4) = \frac{\begin{bmatrix} \{X(1) + \Delta X(1)\}/L(1) + \{X(2) + \Delta X(2)\}/ \\ L(2) + \{X(3) + \Delta X(3)\}/L(3) \end{bmatrix}}{1/L(1) + 1/L(2) + 1/L(3)} \quad \text{Equation 3}$$

For an arbitrary N-th layer, X(N) denotes a center position of an X-axis alignment mark of the N-th layer on the substrate from the reference position, L(N) denotes a CD of the pattern of the N-th layer, and $\Delta X(N)$ is an offset value of the N-th pattern. Then, a target coordinate AX(N+1) of the alignment mark of the (N+1)-th layer can be calculated as follows:

$$AX(N+1) = \sum_{k=1}^{N} [\{X(k) + \Delta X(k)\}/L(k)] \Big/ \sum_{k=1}^{N} \{1/L(k)\} \quad \text{Equation 4}$$

Equation 4 is applicable to an arbitrary orthogonal coordinate system, and to the X axis and the Y axis orthogonal to the X axis (or two orthogonal directions) independently, and the target coordinate AY(N+1) of the (N+1)-th layer can be calculated as follows:

$$AY(N+1) = \sum_{k=1}^{N} [\{Y(k) + \Delta Y(k)\}/L(k)] \Big/ \sum_{k=1}^{N} \{1/L(k)\} \quad \text{Equation 5}$$

This embodiment is not subject to a limitation of setting of the coordinate system. In this embodiment, the X-axis alignment mark is independent of the Y-axis alignment mark, but the present invention is applicable to an alignment method that uses one alignment mark used to simultaneously measure positional information in two orthogonal directions, i.e., the X-axis direction and the Y-axis direction.

The off-axis measurement unit 7 may measure an alignment mark coordinate and the offset information of each layer at the position measurement time for all layers. Alternatively, by storing the alignment mark position and the offset information which the off-axis measurement unit 7 has previously measured in a memory 16a connected to the controller 16, and the off-axis measurement unit 7 may measure only the uppermost layer. In that case, the memory 16a stores a previous measurement result of the off-axis measurement unit 7. The measurement unit to be used may differ according to the pattern CD and necessary precision of each layer. In that case, the obtained alignment mark position, the offset information of the original used to expose each layer, and the offset information peculiar to the alignment unit used to expose each layer may be used to shorten the measurement time. For this purpose, the alignment mark position and the above offset information may be obtained from the database and used as well as weight information.

A description will now be given of an apparatus application mode when a plurality of layers are formed on the substrate by the lithography process. In forming a pattern on the substrate, an apparatus having a high alignment precision is used for the lowermost layer that requires a high alignment precision. An apparatus having a moderate alignment precision is used for lower layers from the second layer to about the seventh layer that require a moderate alignment precision, and an apparatus having a low precision for a rough layer is used to form upper patterns. There are a plurality of apparatuses having similar alignment accuracies and a plurality of originals having the same transfer image in the device manufacturing facility. The apparatus and original used to form the next layer on the substrate are properly selected in accordance with the operational status of each apparatus and the original. Thus, the apparatus and the original used to form the transfer image in each layer on the substrate are usually different for each production lot, and the apparatus and the original used to form each layer have unique offsets.

With the foregoing in mind, the present invention collects offset information peculiar to the original and each apparatus that are used to expose each layer on the substrate, and manages that information in the database 52 outside the apparatus. That information and the weight are sent to the apparatus that will be used to expose the next layer.

A description will be given where an apparatus used to expose the N-th layer is different from an apparatus used to expose the (N+1)-th layer. Initially, the apparatus used to expose the N-th layer ends the exposure. Before the exposure of the N-th layer, that apparatus measures the alignment mark position of the (N−1)-th layer, and consequently an acquisition of the alignment mark position information of the (N−1)-th layer is completed. The obtained (N−1)-th alignment mark position information and the offset information of the apparatus used to expose the N-th layer are sent to the database 52 outside of the apparatus. The apparatus used to expose the (N+1)-th layer obtains the offset information of the apparatus that has measured the alignment mark position of the (N−1)-th layer and the alignment mark position information of the (N−1)-th layer from the database 52. In addition, the apparatus used to expose the (N+1)-th layer measures the alignment mark position of the N-th layer and obtains the offset information of the apparatus that has exposed the N-th layer. The alignment mark positions of the (N−1)-th layer and the N-th layer are corrected using the offset information so as to reflect the correction in the exposure for the (N+1)-th layer. When there are an (N−2)-th layer, an (N−3)-th layer, . . . , under the (N−1)-th layer, the alignment mark position information of (N−1)-th layer, (N−2)-th layer, and (N−3)-th layer and previous layers and the offset information of the exposure apparatuses that have exposed these layers may be obtained and reflected for the exposure of the (N+1)-th layer. When a plurality of apparatuses share information of each apparatus via the database 52 outside of the apparatus, the overlay accuracy of the pattern which would otherwise occur due to use of a plurality of apparatuses becomes less likely to deteriorate.

Thus, by using for an alignment the offset information peculiar to each apparatus and the original used to expose each layer on the substrate, higher alignment accuracy can be secured than that of an alignment that uses information possessed only by one apparatus.

When a strict alignment is not required for a predetermined axis or a predetermined layer, the alignment time can be shortened in exchange for the reduced number of alignment marks and the reduce measurement precision.

This embodiment forms alignment marks in all layers on the substrate but, if there is a layer that has no alignment mark zero may be substituted for the above equation. Moreover, the off-axis measurement unit 7 may measure a coordinate of an alignment mark when the substrate stage 5 is maintained stationary or when the substrate stage 5 is maintained scanned.

In exposure, the controller 16 determines a target coordinate based on a weighted average result that is made by weighting a coordinate of the center position of the alignment mark formed on each layer on the substrate using a weight determined by a function inversely proportional to the CD of the pattern of the original formed in each layer on the substrate 2. While this embodiment uses a reciprocal of the CD as a function inversely proportional to the pattern's CD, a factorial of the reciprocal of the CD or a square or cubic root of the reciprocal of the CD may be used. The controller 16 illuminates the original 3 using the light from the illumination unit 17, and exposes a pattern of the original 3 onto the substrate 2 via the projection optical system 1. This process is repeated for each of the plurality of layers on the substrate. A pattern of each pattern is properly aligned, and the overlay accuracy improves.

A method for manufacturing a device (such as a semiconductor integrated circuit device and a liquid crystal display device) includes the step of exposing a photosensitive agent applied substrate (such as a wafer and a glass plate) using an exposure apparatus of one of the above embodiments, the step of developing the substrate, and the other known step.

While the alignment unit of this embodiment is applied to the exposure apparatus, it may be applied to an alignment between a mold (original) and a substrate in a nanoimprint.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2008-246364, filed Sep. 25, 2008, and No. 2009-134737, filed on Jun. 4, 2009 which are hereby incorporated by reference herein in its entirety.

What is claimed is:

1. An alignment unit configured to align a pattern of an original having the pattern and an alignment mark, with an area in an uppermost layer in a plurality of layers of a substrate in transferring the pattern to the area, the alignment unit comprising:
   a measurement unit configured to measure a coordinate of a center position of the alignment mark transferred to each layer that is located under the uppermost layer of the substrate; and
   a controller configured to determine a target coordinate of the center position of the alignment mark transferred to the uppermost layer of the substrate based on a result of a weighted average that is made by weighting the coordinate of the center position of the alignment mark of each layer of the substrate measured by the measurement unit using as a weight a function inversely proportional to a minimum critical dimension of the pattern of the original formed on each layer of the substrate.

2. The alignment unit according to claim 1, wherein the controller weights with the weight a value that is made by adding an offset value to the coordinate of the center position of the alignment mark of each layer of the substrate.

3. The alignment unit according to claim 1, wherein the controller determines the target coordinate of the center position of the alignment mark in two orthogonal directions independently.

4. The alignment unit according to claim 1, further comprising a memory configured to store a previous measurement result of the measurement unit,
   wherein the controller uses information stored in the memory for the weighted average.

5. An exposure apparatus comprising:
   an alignment unit configured to align a pattern of an original having the pattern and an alignment mark, with an area in an uppermost layer in a plurality of layers of a substrate in transferring the pattern to the area; and
   a projection optical system configured to project the pattern of the original onto the substrate after the alignment unit provides an alignment between the pattern of the original with the area of the substrate,
   wherein the alignment unit includes:
   a measurement unit configured to measure a coordinate of a center position of the alignment mark transferred to each layer that is located under the uppermost layer of the substrate; and
   a controller configured to determine a target coordinate of the center position of the alignment mark transferred to the uppermost layer of the substrate based on a result of a weighted average that is made by weighting the coordinate of the center position of the alignment mark of each layer of the substrate measured by the measurement unit using as a weight a function inversely proportional to a minimum critical dimension of the pattern of the original formed on each layer of the substrate.

6. A device manufacturing method comprising the steps of:
   exposing a substrate using an exposure apparatus; and
   developing the substrate that has been exposed,
   wherein an exposure apparatus includes:
   an alignment unit configured to align a pattern of an original having the pattern and an alignment mark, with an area in an uppermost layer in a plurality of layers of a substrate in transferring the pattern to the area; and
   a projection optical system configured to project the pattern of the original onto the substrate after the alignment unit provides an alignment between the pattern of the original with the area of the substrate,
   wherein the alignment unit includes:
   a measurement unit configured to measure a coordinate of a center position of the alignment mark transferred to each layer that is located under the uppermost layer of the substrate; and
   a controller configured to determine a target coordinate of the center position of the alignment mark transferred to the uppermost layer of the substrate based on a result of a weighted average that is made by weighting the coordinate of the center position of the alignment mark of each layer of the substrate measured by the measurement unit using as a weight a function inversely proportional to a minimum critical dimension of the pattern of the original formed on each layer of the substrate.

* * * * *